(12) United States Patent
Anderson et al.

(10) Patent No.: US 7,960,791 B2
(45) Date of Patent: Jun. 14, 2011

(54) DENSE PITCH BULK FINFET PROCESS BY SELECTIVE EPI AND ETCH

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1554 days.

(21) Appl. No.: 11/160,457

(22) Filed: Jun. 24, 2005

(65) Prior Publication Data

US 2006/0292772 A1  Dec. 28, 2006

(51) Int. Cl.
*H01L 29/06* (2006.01)
*H01L 31/06* (2006.01)

(52) U.S. Cl. ........... 257/349; 257/903; 257/E21.661; 257/E21.703; 257/E27.1; 257/E27.112

(58) Field of Classification Search .......... 257/347, 257/296, 302–304, 310, 349, 903, E21.661, 257/E21.703, E27.1, E27.112, E29.298
See application file for complete search history.

(56) References Cited

U.S. PATENT DOCUMENTS

| 5,604,368 | A | 2/1997 | Taur et al. | |
| 6,413,802 | B1 | 7/2002 | Hu et al. | |
| 6,888,199 | B2 * | 5/2005 | Nowak et al. | 257/347 |
| 7,355,253 | B2 * | 4/2008 | Cohen | 257/365 |
| 2003/0201458 | A1 | 10/2003 | Clark et al. | |
| 2004/0099903 | A1 | 5/2004 | Yeo et al. | |
| 2004/0110097 | A1 | 6/2004 | Ahmed et al. | |
| 2004/0169239 | A1 | 9/2004 | Rim | |
| 2005/0040444 | A1 * | 2/2005 | Cohen | 257/288 |
| 2005/0202604 | A1 * | 9/2005 | Cheng et al. | 438/151 |

* cited by examiner

*Primary Examiner* — Zandra Smith
*Assistant Examiner* — Tsz K Chiu
(74) *Attorney, Agent, or Firm* — Gibb I.P. Law Firm, LLC

(57) ABSTRACT

Disclosed is a method of forming a pair of transistors by epitaxially growing a pair of silicon fins on a silicon germanium fin on a bulk wafer. In one embodiment a gate conductor between the fins is isolated from a conductor layer on the bulk wafer so a front gate may be formed. In another embodiment a gate conductor between the fins contacts a conductor layer on the bulk wafer so a back gate may be formed. In yet another embodiment both of the previous structures are simultaneously formed on the same bulk wafer. The method allow the pairs of transistors to be formed with a variety of features (e.g., strained fins, a space between two fins that is approximately 0.5 to 3 times greater than a width of a single fin, a first dielectric layer on the inner sidewalls of each pair of fins with a different thickness and/or a different dielectric material than a second dielectric layer on the outer sidewalls of each pair of fins, etc.).

19 Claims, 7 Drawing Sheets

DENSE PITCH BULK FINFET PROCESS BY SELECTIVE EPI AND ETCH

BACKGROUND OF THE INVENTION

1. Field of the Invention

The invention generally relates to a fin-type field effect transistor (FinFET), and more particularly, to a method for manufacturing multiple fins having a dense pitch.

2. Description of the Related Art

A fin-type field effect transistor (FinFET) is a type of transistor that has a fin, containing a channel region and source and drain regions. A double-gated FinFET is a FinFET with gate conductors on both sidewall of the fin. The gate conductors cover the channel region of the fin, whereas the source and drain regions of the fin extend beyond the coverage of the gate conductors. FinFETs are discussed at length in U.S. Pat. No. 6,413,802 to Hu et al. (hereinafter "Hu"), which is incorporated herein by reference. FinFETs may comprise only front and/or back gate conductors. Front gate conductors are generally isolated from any conductive material in the substrate and contacts to front gate conductors are etched from above. Back gate conductors are generally electrically connected to a conductive material in the substrate and contacts to the back conductors are etched from below. In order to improve upon current technology, manufacturers are continuously striving to increase the density of devices on integrated circuits and to simultaneously decrease the cost of producing the integrated circuits without adversely affecting performance. FinFET processing is often accomplished using a silicon-on-insulator (SOI) wafer due to the need for isolation of front gates and the ease of defining the fin height. Disadvantages of processing FinFETs in this manner include the high cost of SOI wafers and limitations on device scaling, and particularly, limitations on pitch between devices.

SUMMARY OF THE INVENTION

In view of the foregoing, the present invention comprises an integrated circuit structure having a pair of transistors with a dense pitch on a bulk wafer and a method for forming the pair of transistors. Three structures are disclosed: a first structure having a first pair of silicon fins with a back gate between the pair of silicon fins, a second structure having a second pair of silicon fins with a front gate (e.g., double gate) between the pair of silicon fins, and a third structure comprising both the first and second structures on the same wafer. The fins all have an approximately equal width and inner and outer sidewalls. Each fin is positioned on an insulator layer (e.g., silicon dioxide) above a conductor layer (silicon germanium layer) on a bulk wafer. The pairs of silicon fins are formed using an epitaxy process on silicon germanium, which allows for the fins to be strained as necessary. A space between the two fins has a width that is approximately equal to (e.g., 0.5 to 3 times) the width of one silicon fin (i.e., the width of a silicon fin is approximately equal to (e.g., ⅓ to 2 times) the width of the space between the fins). The first structure can comprise a first gate conductor, configured as a back gate (e.g., electrically connected to the conductor layer), in the first space adjacent the inner sidewalls of the first pair of fins. The second structure can comprise a second gate conductor, configured as a front gate (e.g., electrically isolated from the conductor layer by another dielectric layer), in the second space adjacent the inner sidewalls of the second pair of fins. The pairs of fins each have a pitch (i.e., distance between center points of the fins) that is limited to the width of the space between the fins plus the width of one fin. The first and second structures can also each comprise additional gate conductors adjacent the outer sidewalls of each pair of fins. The additional gate conductors may comprise either the same or different conductive material as the first and second gate conductors, respectively. Additionally, a pair of fins (e.g., first and/or second pair of fins) may have a first gate dielectric layer on the inner sidewalls of each fin and a second gate dielectric layer on the outer sidewalls of each fin. The first gate dielectric layer can comprise a different dielectric material and can have a different thickness than the second gate dielectric layer.

An embodiment of a method of forming a pair of transistors comprises forming a pair of silicon fins on an insulator layer using a bulk wafer such that each fin has a width that is approximately ⅓ to 2 times the width of the space between the two fins. More particularly, a silicon germanium layer is formed on a bulk wafer. The silicon germanium layer is patterned and etched partially into the silicon germanium layer to form a silicon germanium fin with a predetermined width. An insulator layer is then formed on the silicon germanium layer adjacent a lower portion of the silicon germanium fin. Then, a pair of silicon fins is formed by epitaxially growing a silicon layer (which may or may not be strained) on the silicon germanium fin. The top surface of the silicon layer is oxidized and then a conductive material is deposited over the silicon layer. Films above a top surface of the silicon germanium fin are removed. Once the top surface of the silicon germanium fin is exposed, an upper portion the silicon germanium fin is removed such that the pair of silicon fins is formed from the remaining silicon layer and a space remains between the two silicon fins. A width of the space is approximately equal to the predetermined width of the original silicon germanium fin (e.g., 0.5-3 times the width of one silicon fin). First and second gate dielectric layers are formed on each of the silicon fins using a two stage process. The second dielectric layer is formed on the outer sidewalls of the pair of fins when the surface of the silicon layer is oxidized. To form the first dielectric layer, the upper portion of the silicon germanium fin is removed, thereby, exposing the inner sidewalls of the pair of fins. The exposed inner sidewalls are oxidized to form the first gate dielectric layer. The first gate dielectric layer may have a different thickness and/or a different dielectric material than the second gate dielectric layer. Furthermore, when the upper portion of the silicon germanium fin is removed, a lower portion remains on the conductor layer. Upon oxidizing the exposed inner sidewalls of the pair of silicon fins, the remaining lower portion of the silicon germanium fin is simultaneously oxidized and forms an additional dielectric layer. This additional dielectric layer will electrically isolate the gate conductor from the conductor layer so that a front gate may be formed between the two fins with further processing. Alternatively, after forming the additional dielectric layer and before forming the gate conductor, the additional dielectric layer may be removed. Removing the additional dielectric layer allows the gate conductor to contact the conductor layer so that a back gate may be formed between the two fins with further processing.

Additionally, the method may comprise simultaneously forming at least two pairs of transistors on the same bulk wafer such that a first pair is configured for a back gate between the two fins and a second pair is configured for a front gate (e.g., double gate) between the two fins. For example, the method may comprise simultaneously forming at least two pairs of fins (a first pair of fins separated by a first space and a second pair of fins separated by a second space) on the same bulk wafer and following the processing steps as described above. However, once the remaining lower portions of the silicon germanium fins in the first space and the second space are oxidized, the additional dielectric layer formed in the second space is masked. Then, the additional dielectric layer formed in the first space is removed and the mask is then removed. Again, processing continues, as described above.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
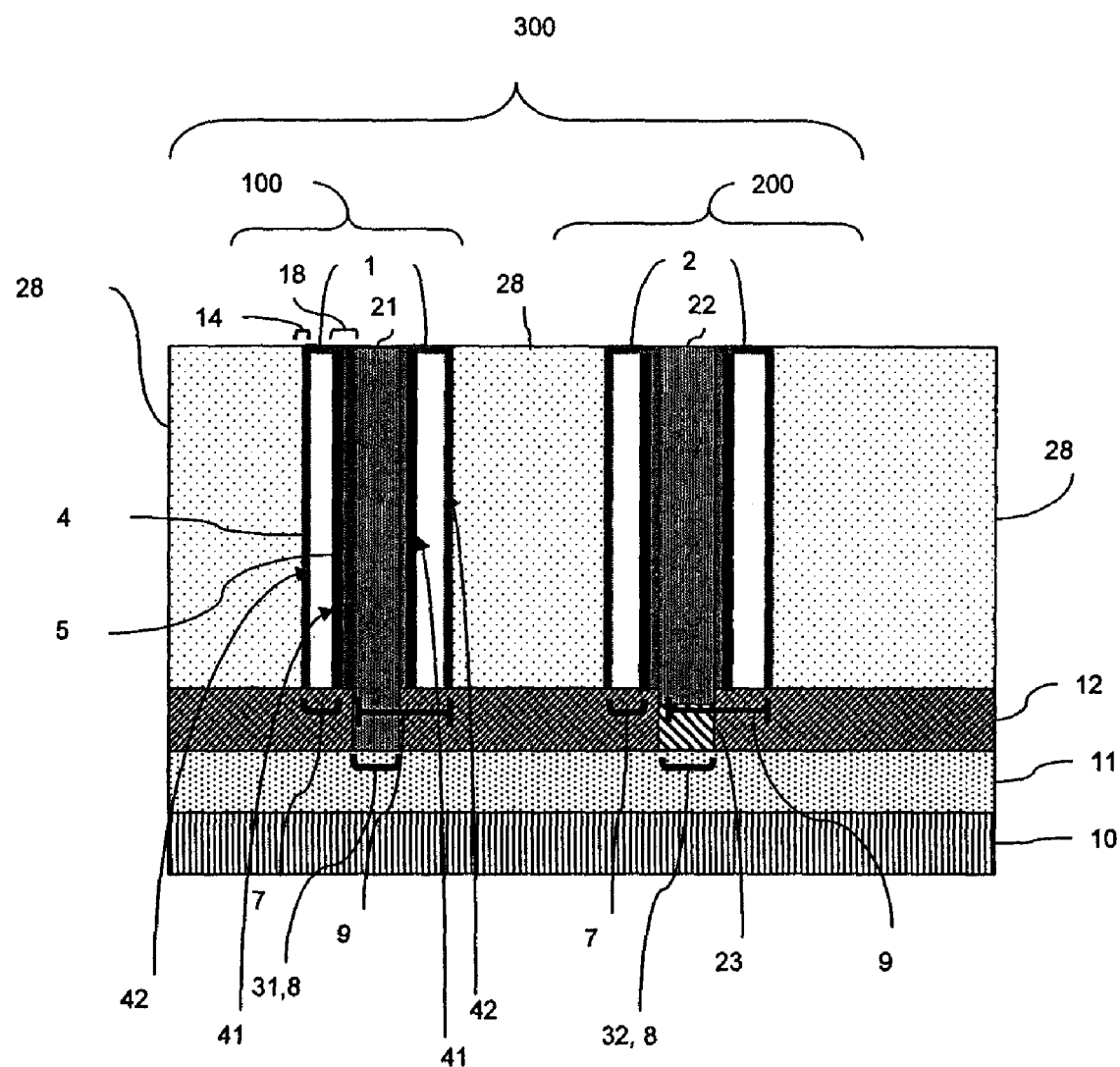
FIG. 1 is a schematic diagram illustrating the completed structures 100, 200, and 300 of the present invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As discussed above, in order to improve upon current technology, manufacturers are continuously striving to increase the density of devices on integrated circuits and to simultaneously decrease the cost of producing the integrated circuits without adversely affecting performance. FinFET processing is often accomplished using a silicon-on-insulator (SOI) wafer due to the need for isolation of front gates and the ease of defining the fin height. Disadvantages of processing FinFETs in this manner include the high cost of SOI wafers and limitations on device scaling, and particularly, limitations on establishing a dense pitch between devices. Epitaxially growing semiconductor structures for double-gate metal oxide semiconductor field effect transistors (MOSFETs) is known (see U.S. Pat. No. 5,604,368, to Taur et al, issued on Feb. 18, 1997, and incorporated herein by reference). However, a recent invention discloses a method of forming silicon fins for a finFET device by epitaxially growing a silicon layer on sidewalls of a relaxed silicon germanium layer (see U.S. Patent Application Publication No. US2004/0169239, invented by Rim, published on Sep. 2, 2004, and incorporated herein by reference). The Rim invention forms silicon fins on SOI wafers or, alternatively, forms silicon fins on a graded silicon germanium layer on a silicon substrate. The present invention improves upon the Rim invention. Specifically, the present invention discloses integrated circuit structures, having multiple densely spaced thin silicon fins, and the associated methods of forming the structures on a bulk wafer to decrease costs.

In view of the foregoing, the present invention discloses integrated circuit structures having pairs of transistors with a dense pitch and a method for forming the structures. Structures 100, 200 and 300 of the present invention are illustrated in FIG. 1. Specifically, structure 100 illustrates a dense pitch two-fin integrated circuit structure configured for a back gate in a first space 31 between the first pair of silicon fins 1. Structure 200 illustrates a dense pitch two-fin integrated circuit structure configured for a front gate (e.g., a double gate) in the second space 32 between the second pair of silicon fins 2. Structure 300 illustrates two dense pitch two-fin structures 100 and 200 on the same bulk wafer 10. The fins of each pair 1, 2 all have an approximately equal width 7 and an inner 41 and outer 42 opposing sidewall. Each fin is positioned on an insulator layer 12 (e.g., silicon dioxide). The first and second pairs of silicon fins 1, 2 are formed using an epitaxy process on silicon germanium, which allows for the fins to be strained as necessary. The first and second spaces 31, 32 between the first and second pairs of silicon fins 1, 2, respectively, each have an approximately equal width 8. The width 8 of the spaces 31, 32 is approximately equal to (e.g., 0.5 to 3 times) the width 7 of the silicon fins. The insulator layer 12 is formed on a conductor layer 11 (e.g., silicon germanium film layer) which is in turn formed on a bulk wafer 10. A first gate conductor 21 can be formed in the first space 31 adjacent the inner sidewalls 41 of the first pair of fins 1 and configured for a back gate for structure 100. A second gate conductor 22 can be formed in the second space 32 adjacent the inner sidewalls 41 of the second pair of fins 2 and configured for a front gate for structure 200. The pairs of fins 1, 2 each have a pitch (i.e., distance between center points of the fins) that is limited to the width 8 of the space 31 or 32 plus the width 7 of one fin. The structures 100 and 200 can also each comprise additional gate conductors 28 adjacent the outer sidewalls 42 of each fin. The additional gate conductors 28 may comprise either the same conductive material as the first and second gate conductors 21, 22 or a different conductive material (e.g., different highly-doped polysilicon materials or metal materials such as TiN). Additionally, each fin may have a first gate dielectric layer 5 and a second gate dielectric layer 4 on the inner 41 and outer 42 opposing sidewalls, respectively. The first gate dielectric layer 5 can comprise a different dielectric material and can have a different thickness 18 than the thickness 14 than the second gate dielectric layer 4. Referring to structure 100, the first gate conductor 21 may extend through the insulator layer 12 and contact the conductor layer 11 so that a back gate may be formed during further processing. Alternatively, referring to the structure 200, the second gate conductor 22 may be isolated from the conductor layer 11 by an additional dielectric layer 23 positioned between the first gate conductor 22 and the conductor layer 11 so that a front gate (e.g., a double gate) may be formed during further processing.

Figure 2:
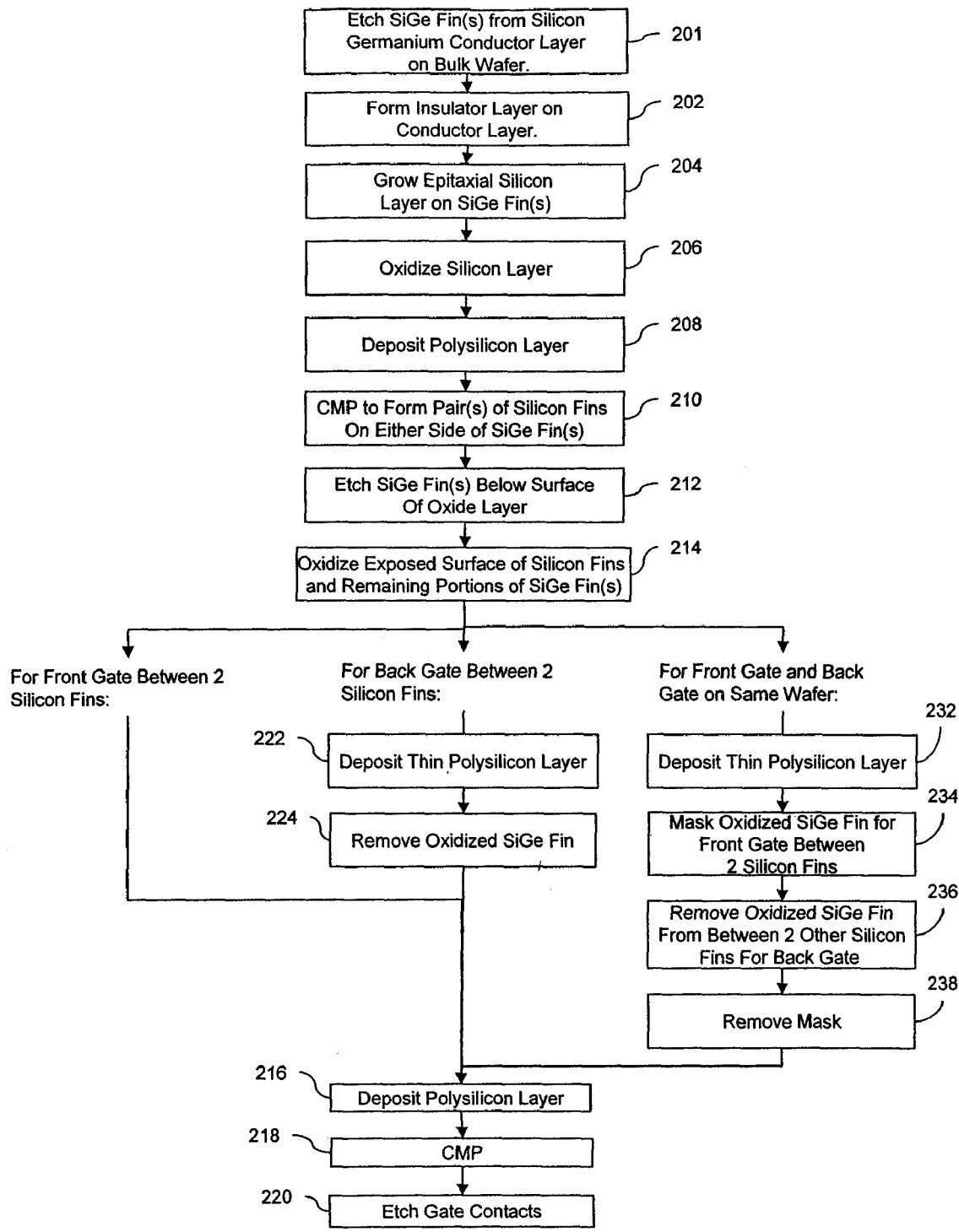
FIG. 2 is a flow diagram illustrating a method of the invention.
Figure 3:
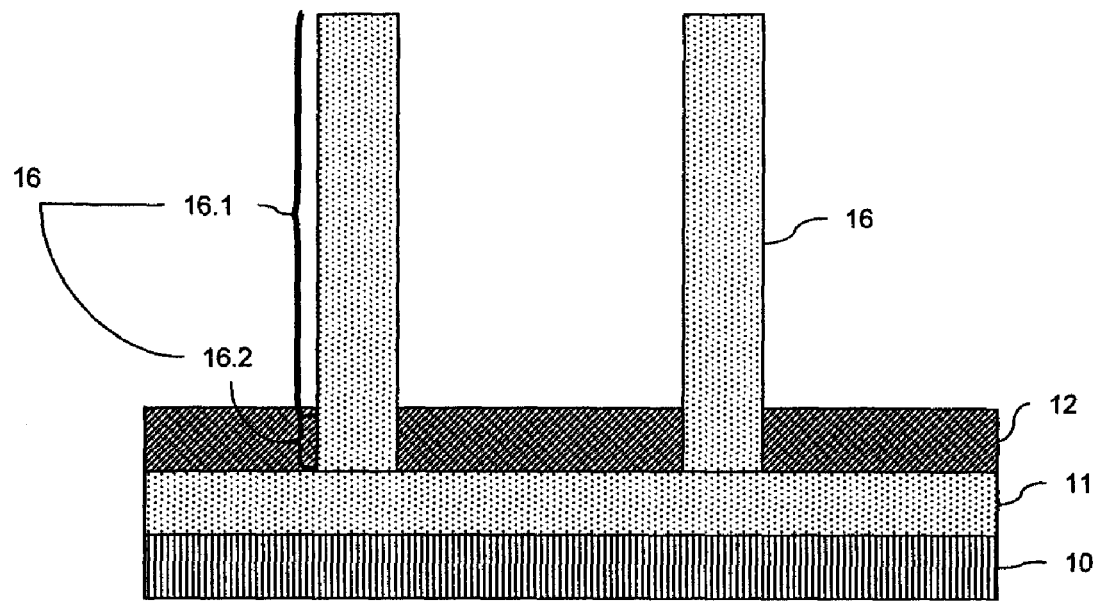
FIG. 3 is a schematic diagram of a partially completed structure of the present invention.

Referring to FIG. 2 in combination with FIG. 1, an embodiment of a method of forming a multiple fin integrated circuit structure 100 or 200 comprises forming a silicon germanium fin 16 (201). Specifically, a thick silicon germanium conductor layer 11 is formed on a bulk wafer 10. A photoresist layer is deposited on the conductor layer 11, lithographically patterned and an etching processes is formed such that a silicon germanium fin 16 is formed a portion of the conductor layer 11 remains on the bulk wafer 10. The photoresist will be patterned such that the silicon germanium fin 16 has a predetermined width 8 (e.g., a state-of-the-art minimum lithographic dimension) that is approximately equal to the desired spacing between the pair of silicon fins (e.g., 0.5-3 times the width 7 of the silicon fins). Once the silicon germanium fin 16 is formed an insulator layer 12 is formed on the conductor layer 11 adjacent a lower portion 16.2 of the silicon germanium fin 16 (202, see FIG. 3). Thus, the silicon germanium fin 16 extends through the insulator layer 12.

Figure 4:
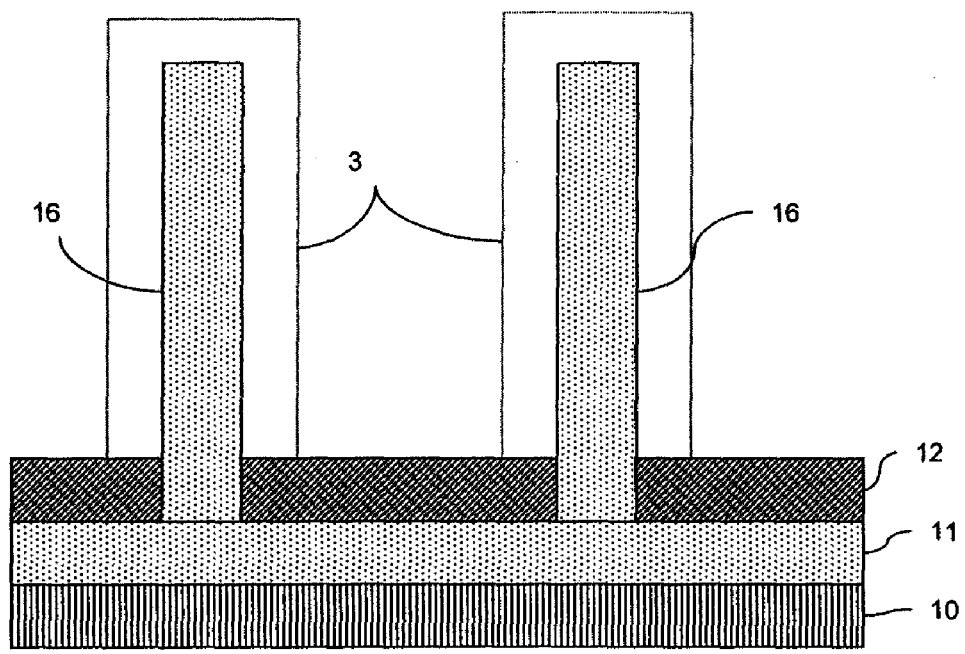
FIG. 4 is a schematic diagram of a partially completed structure of the present invention.
Figure 5:
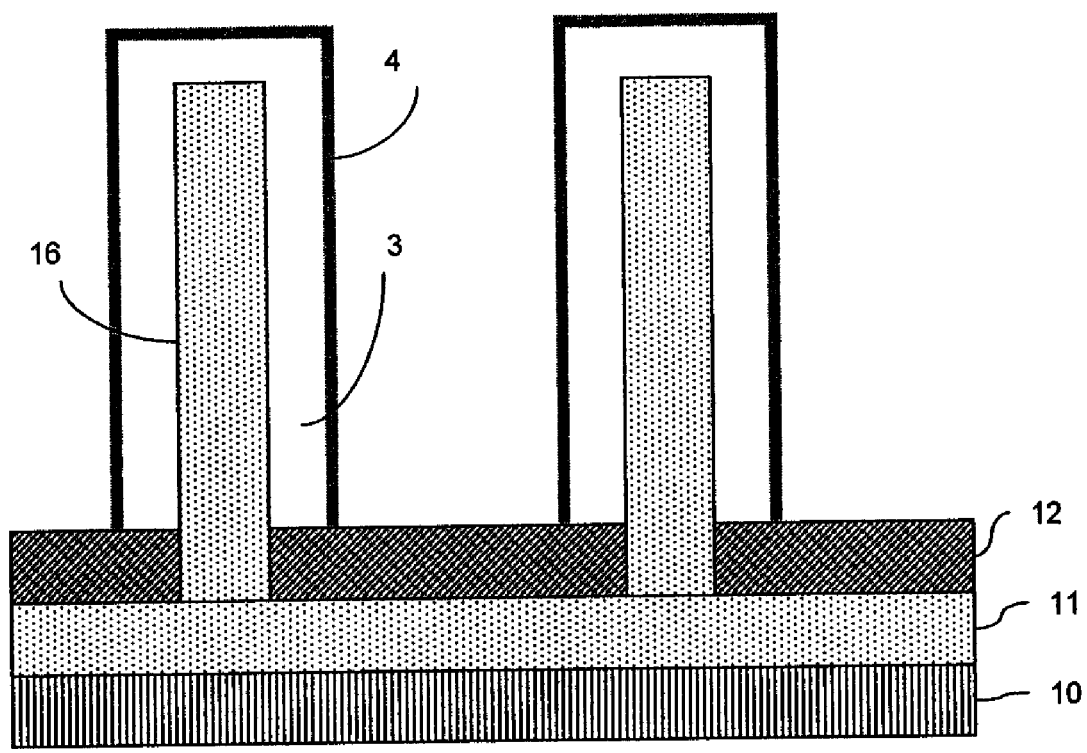
FIG. 5 is a schematic diagram of a partially completed structure of the present invention.
Figure 6:
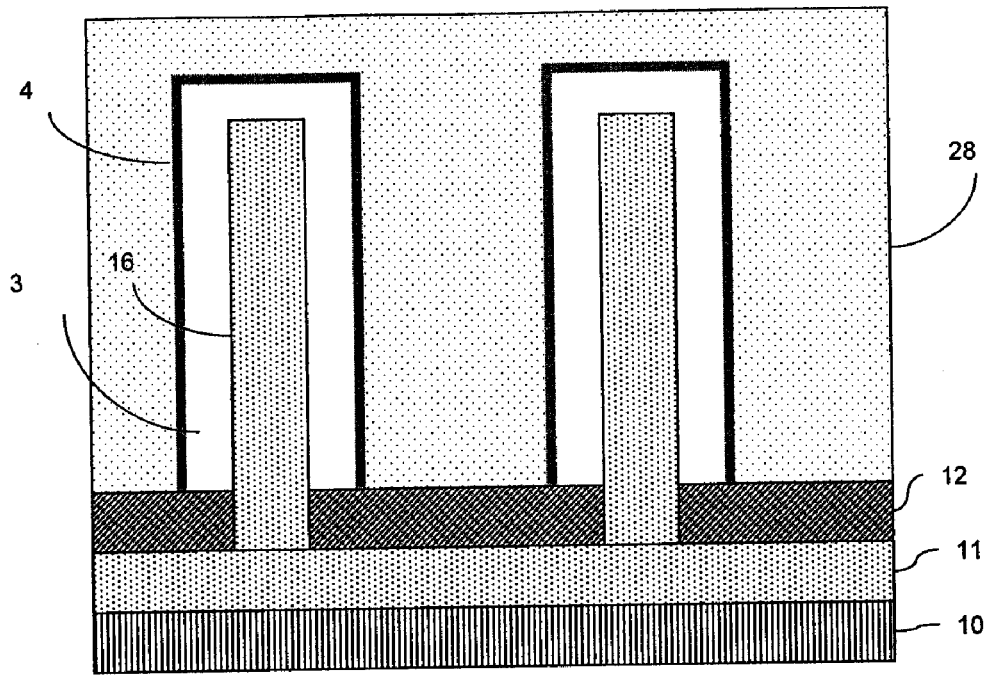
FIG. 6 is a schematic diagram of a partially completed structure of the present invention.
Figure 7:
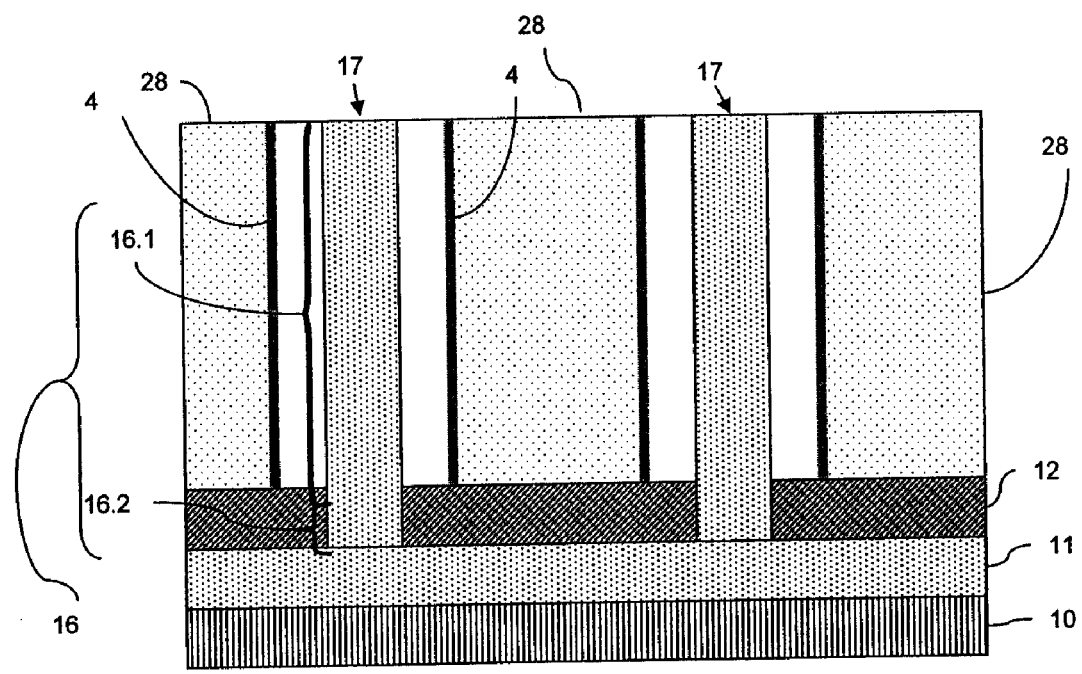
FIG. 7 is a schematic diagram of a partially completed structure of the present invention.

The a first and/or a second pair of silicon fins 1, 2 (see FIG. 1) can be formed by epitaxially growing a thin silicon layer 3 on the silicon germanium fin 16 (204, see FIG. 4). The epitaxy process may be such that the silicon layer 3 that is grown is strained and is ⅓ to 2 times the predetermined width 8 of the silicon germanium fin 16. After forming the silicon layer 3 at process 204, a dielectric layer is formed on an outer surface of the silicon layer 3 (e.g., by depositing a dielectric material, by oxidizing the top surface of the silicon layer, etc.), thereby forming what will ultimately be the second gate dielectric layer 4 on each pair of silicon fins 1, 2 (206, see FIG. 5). A first conductive material 28, such as a highly doped polysilicon or metal (e.g., TiN), is then deposited over the silicon germanium fin 16. This first conductive material 28 eventually forms the additional gate conductors 28 of FIG. 1 (208, see FIG. 6). Then, a polishing process is performed (e.g., chemical mechanical polishing (CMP)) to removed the silicon layer 3 off the top surface 17 of the silicon germanium fin 16 (210, see FIG. 7).

Figure 8:
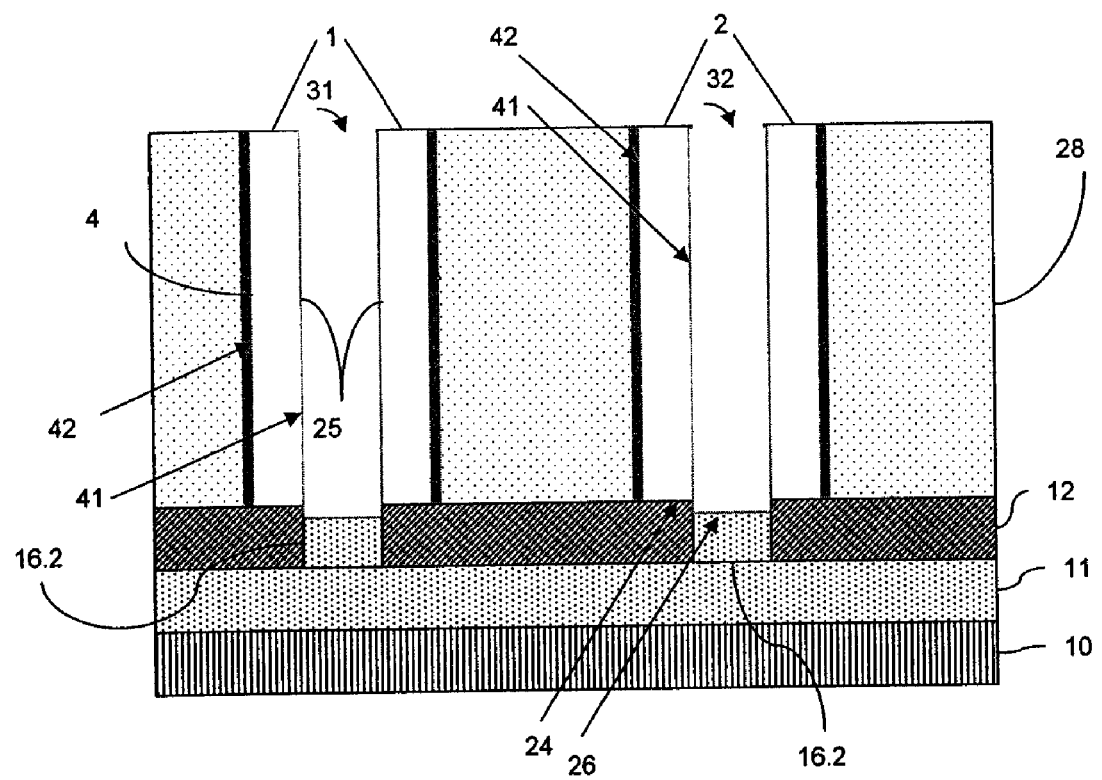
FIG. 8 is a schematic diagram of a partially completed structure of the present invention.
Figure 9:
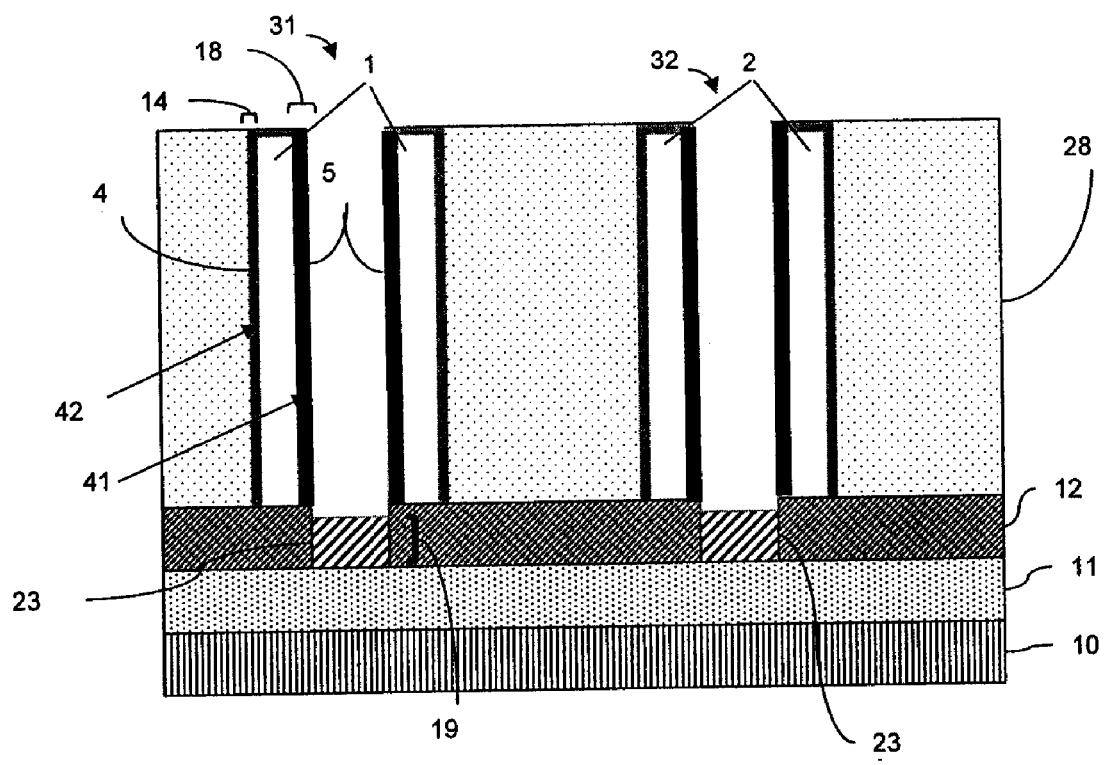
FIG. 9 is a schematic diagram of a partially completed structure of the present invention.

Once the top surface 17 of the silicon germanium fin 16 is exposed at process 210, an upper portion 16.1 of the silicon germanium fin 16 above the insulator layer 12 is removed (e.g., by selective etching) such that a pair of silicon fins (e.g., first pair of silicon fins 1 and second pair of silicon fins 2) is formed from the remaining silicon layer 3 (212, see FIG. 8). The space between each silicon fin of a pair of silicon fins (e.g., first space 31 between a first pair of fins 1 and second space 32 between a second pair of fins 2) is, thus, equal to the width of the silicon germanium fin 16 and should be approximately 0.5 to 3 times the width of a single fin in a pair. More specifically, the upper portion 16.1 of the silicon germanium fin 16 is selectively etched to a level 26 below the surface 24 of the insulator layer 12. The resulting pairs of fins (e.g., a first pair 1 and a second pair 2) each comprise an oxidized outer sidewall 42 (i.e., a second gate dielectric layer 4 on an outer sidewall 42) and an exposed inner sidewall 41. The exposed inner silicon sidewalls 41 of each fin are then oxidized to form the first gate dielectric layer 5 on the inner sidewalls 41 of each silicon fin in each pair 1, 2 (214, see FIG. 9). The thickness 18 of the first gate dielectric layer 5 may be different than the thickness 14 of the second gate dielectric layers 4. Additionally, the first and second dielectric layers 4, 5 may be formed of different dielectric materials.

In addition to forming the first gate dielectric layer 5 the oxidation process 214 will also oxidize the remaining lower portion 16.2 of the silicon germanium fin 16 that is left on the conductor layer 11 below the surface 24 of the insulator layer 12. This additional dielectric layer 23 that is formed in the spaces 31 and 32 can be used to electrically isolate a gate conductor formed in the space above from the conductor layer 11. It should be noted that while the exposed inner sidewalls 41 of the fins are oxidized simultaneously with the remaining portion 16.2 of the silicon germanium fin 16, a thickness 19 of the additional dielectric layer 23 that is formed may be greater than the thickness 18 of the first dielectric layer 5 because of the faster rate at which silicon germanium oxidizes.

Figure 11:
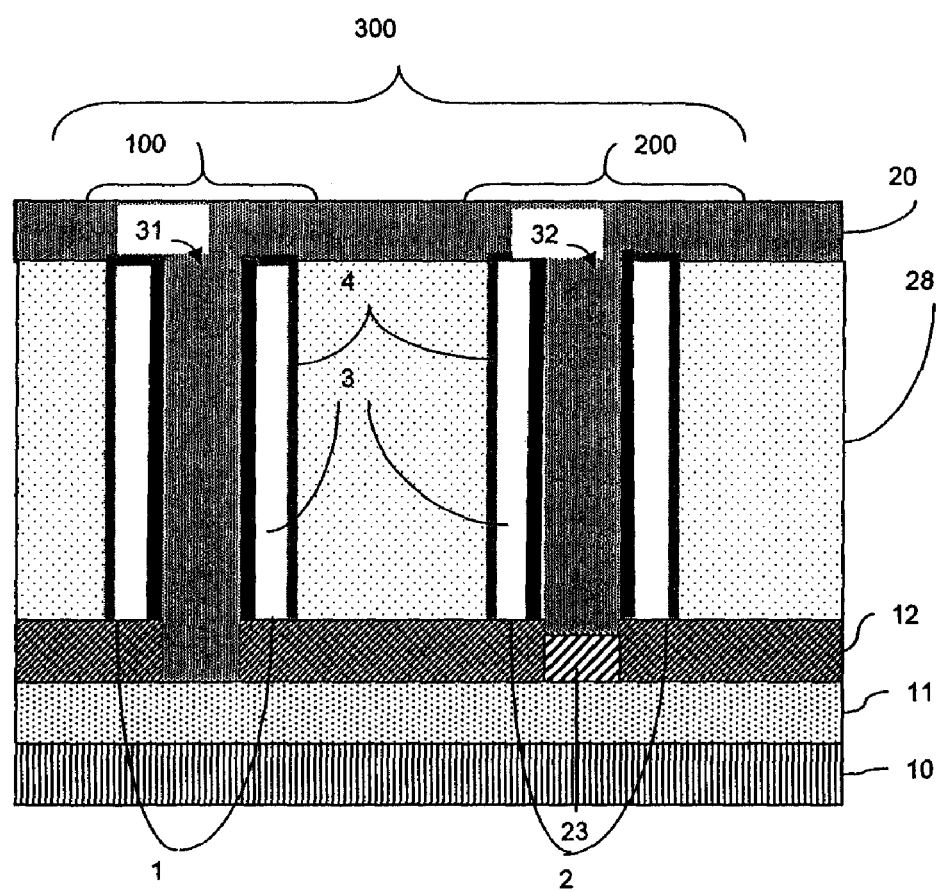

Up until this point, structures 100 and 200 can be formed using the same processes as described above. Structure 200 may be completed by depositing a second conductive material 20 (e.g., a highly doped polysilicon or a metal) over the additional dielectric layer 23 in the space 32 between the pair of fins 2 (216, see FIG. 11). This second conductive material 20 may be either the same material or a different material as the first conductive material 28 deposited at process 208. The conductive material 20 is then polished (e.g., by CMP) and, thus, second gate conductor 22 of structure 200 is formed (218, see FIG. 1). Once the second gate conductor 22 of structure 200 is completed at process 218, additional finFET processing may be conducted to complete the two finFETs of structure 200 (e.g., etching gate contacts) (220).

Alternatively, structure 100 may be completed by removing the additional dielectric layer 23 (224) from within space 31 prior to depositing the second conductive material 20 (226). For example, after forming the additional dielectric layer 23, a thin layer of polysilicon may be deposited within space 31. Then, a spacer etching process may be used to selectively remove the additional dielectric layer 23 from space 31. As discussed above with regard to structure 200, this second conductive material 20 may be either the same material or a different material as the first conductive material 28 deposited at process 208. The second conductive material 20 is then polished (e.g., by CMP) and, thus, first gate conductor 21 of structure 100 is formed (218, see FIG. 1). Once the first gate conductor 21 of structure 100 is completed at process 218, additional finFET process may be conducted to form complete the two finFETS of structure 100. (e.g., etching gate contacts) (220). Removing the additional dielectric layer 23 at process 224 allows the first gate conductor 21 to be to contact the conductor layer 11 in order to form a back gate.

Figure 10:
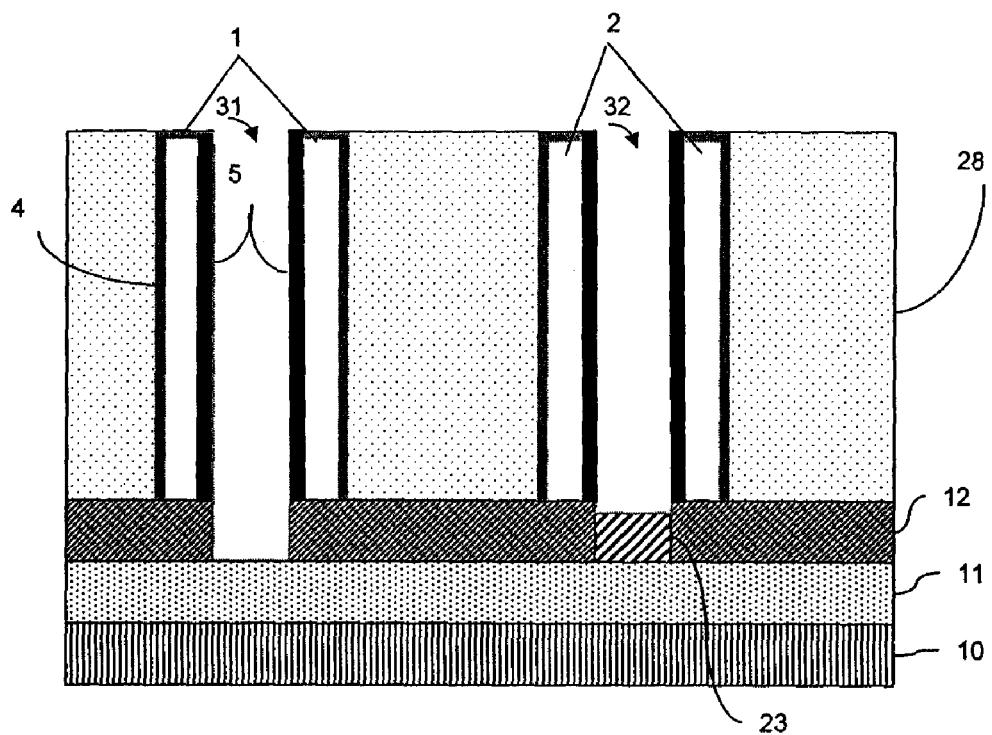
FIG. 10 is a schematic diagram of a partially completed structure of the present invention; and, FIG. 11 is a schematic diagram of a partially completed structure of the present invention.

An embodiment of a method of forming the combination structure 300 comprises simultaneously forming the two alternative structures 100 and 200 on the same bulk wafer 10. Referring again to FIG. 2, in order to form structures 100 and 200 on the same wafer 10, multiple silicon germanium fins 16 are formed at process 201. These multiple silicon germanium fins 16 may be used to simultaneously form multiple structures 100 and/or multiple structures 200 on the same bulk wafer 10. In order to form the structure 300 with a combination of both structures 100 and 200, then processes 201-214 as described above are completed to form at least one first pair of silicon fins 1 and at least one second pair of silicon fins 2. Then, a thin polysilicon layer is deposited into the spaces 31 and 32 formed between each pair of silicon fins 1, 2 (232). The space 32 between the second pair of fins 2 is masked (234) and the dielectric layer 23 between the first pair of silicon fins 1 is removed (e.g., by a spacer etching process) (236) and the mask is removed (238; see FIG. 10). Then structure 300 may be completed by depositing a second conductive material 20 (e.g., a highly doped polysilicon or a metal) over the dielectric layer 23 in the space 32 and over the conductor layer 11 in the space 31 (216, see FIG. 11). As discussed above with regard to structures 100 and 200, this second conductive material 20 used to form the first gate conductor 21 may be a different conductive material than the first conductive material 29 deposited at process 208. The second conductive material 20 is then polished (e.g., by CMP) and, thus, a first gate conductor 21 of structure 100 and a second conductor 22 of the structure 200 are formed (218, see FIG. 1). Additional finFET processing may then be conducted to form the complete the respective finFETs (e.g., forming front gate contacts for structure 200 and back gate contacts for structure 100) (220).

Therefore, disclosed above is a method of forming a pair of transistors by epitaxially growing a pair of silicon fins on a silicon germanium fin on a bulk wafer. In one embodiment a gate conductor between the fins is isolated from a conductor layer on the bulk wafer so a front gate may be formed. In another embodiment a gate conductor between the fins contacts a conductor layer on the bulk wafer so a back gate may be formed. In yet another embodiment both of the previous structures are simultaneously formed on the same bulk wafer. The method allow the pairs of transistors to be formed with a variety of features (e.g., strained fins, a space between two fins that is approximately 0.5 to 3 times greater than a width of a single fin, a first dielectric layer on the inner sidewalls of each pair of fins with a different thickness and/or a different dielectric material than a second dielectric layer on the outer sidewalls of each pair of fins, etc.).

What is claimed is:

1. An integrated circuit structure comprising:
   a bulk wafer;
   a silicon germanium conductor layer above and contacting said bulk wafer;
   an insulator layer above and contacting said silicon germanium conductor layer;
   a pair of silicon fins above and contacting said insulator layer, wherein said pair of silicon fins have inner sidewalls separated by a space and wherein a width of said space is 0.5-3 times a width of one of said silicon fins;
   a first dielectric layer adjacent to said inner sidewalls; and
   a gate conductor adjacent to said first dielectric layer and filling said space between said pair of silicon fins,
   wherein said pair of silicon fins further has outer sidewalls opposite said inner sidewalls, wherein said first dielectric layer has a first thickness, and wherein said structure further comprises:
   a second dielectric layer, having a second thickness, on said outer sidewalls, wherein said first thickness is different from said second thickness.

2. The structure of claim 1, further comprising an opening through said insulator layer and aligned below said space, wherein said gate conductor further fills said opening and contacts said silicon germanium conductor layer such that said gate conductor comprises a back gate.

3. The structure of claim 1, further comprising:
   an opening through said insulator layer and aligned below said space; and
   an oxide plug in said opening, wherein said gate conductor is electrically isolated from said silicon germanium conductor layer by said oxide plug such that said gate conductor comprises a front gate.

4. The structure of claim 1, wherein said pair of silicon fins further has outer sidewalls opposite said inner sidewalls and wherein said structure further comprises:
   a second dielectric layer on said outer sidewalls, wherein said first dielectric layer comprises a different dielectric material than said second dielectric layer.

5. The structure of claim 1, wherein each of said silicon fins comprises strained silicon.

6. The structure of claim 1, further comprising:
   a second pair of silicon fins above and contacting said insulator layer, wherein said second pair of silicon fins are separated by a second space;
   a second gate conductor in said second space;
   a first opening through said insulator layer and aligned below said space, wherein said gate conductor fills said first opening and contacts said silicon germanium conductor layer such that said gate conductor comprises a back gate;
   a second opening through said insulator layer and aligned below said second space; and
   an oxide plug in said second opening, wherein said second gate conductor is isolated from said silicon germanium conductor layer by said oxide plug such that said second gate conductor comprises a front gate.

7. The structure of claim 1, wherein said pair of silicon fins further has outer sidewalls opposite said inner sidewalls, wherein said structure further comprises additional gate conductors adjacent said outer sidewalls, and wherein said additional gate conductors comprise a different conductive material than said gate conductor.

8. The structure of claim 1, wherein a width of said space is approximately equal to a width of one of said silicon fins.

9. An integrated circuit structure comprising:
   a bulk wafer;
   a silicon germanium conductor layer above and contacting said bulk wafer;
   an insulator layer above and contacting said silicon germanium conductor layer;
   a pair of silicon fins above and contacting said insulator layer, wherein said pair of silicon fins is separated by a space and wherein a width of said space is 0.5-3 times a width of one of said silicon fins;
   a gate conductor in said space between said pair of silicon fins; and
   an opening through said insulator layer and aligned below said space, wherein said gate conductor further fills said opening and contacts said silicon germanium conductor layer such that said gate conductor comprises a back gate.

10. The structure of claim 9, wherein said pair of silicon fins has inner sidewalls adjacent said gate conductor and further has outer sidewalls opposite said inner sidewalls and wherein said structure further comprises:
    a first dielectric layer, having a first thickness, on said inner sidewalls; and
    a second dielectric layer, having a second thickness, on said outer sidewalls, wherein said first thickness is different from said second thickness.

11. The structure of claim 9, wherein said pair of silicon fins has inner sidewalls adjacent said gate conductor and further has outer sidewalls opposite said inner sidewalls, and wherein said structure further comprises:
    a first dielectric layer on said inner sidewalls; and
    a second dielectric layer on said outer sidewalls, wherein said first dielectric layer comprises a different dielectric material than said second dielectric layer.

12. The structure of claim 9, wherein each of said silicon fins comprises strained silicon.

13. The structure of claim 9, further comprising:
    a second pair of silicon fins above and contacting said insulator layer, wherein said second pair of silicon fins are separated by a second space;
    a second gate conductor in said second space;

a second opening through said insulator layer and aligned below said second space; and an oxide plug in said second opening, wherein said second gate conductor is isolated from said silicon germanium conductor layer by said oxide plug such that said second gate conductor comprises a front gate.

14. The structure of claim 9, wherein said pair of silicon fins has inner sidewalls adjacent said gate conductor and further has outer sidewalls opposite said inner sidewalls, wherein said structure further comprises additional gate conductors adjacent said outer sidewalls, and wherein said additional gate conductors comprise a different conductive material than said gate conductor.

15. The structure of claim 9, wherein a width of said space is approximately equal to a width of one of said silicon fins.

16. An integrated circuit structure comprising:
a bulk wafer;
a silicon germanium conductor layer above and contacting said bulk wafer;
an insulator layer above and contacting said silicon germanium conductor layer;
a pair of silicon fins above and contacting said insulator layer, wherein said pair of silicon fins is separated by a space and wherein a width of said space is 0.5-3 times a width of one of said silicon fins;
a gate conductor in said space between said pair of silicon fins;
an opening through said insulator layer and aligned below said space; and
an oxide plug in said opening, wherein said gate conductor is electrically isolated from said silicon germanium conductor layer by said oxide plug such that said gate conductor comprises a front gate.

17. The structure of claim 16, wherein each of said silicon fins comprises strained silicon.

18. An integrated circuit structure comprising:
a bulk wafer;
a silicon germanium conductor layer above and contacting said bulk wafer;
an insulator layer above and contacting said silicon germanium conductor layer;
a pair of silicon fins above and contacting said insulator layer, wherein said pair of silicon fins is separated by a space and wherein a width of said space is 0.5-3 times a width of one of said silicon fins;
a gate conductor in said space between said pair of silicon fins, wherein said pair of silicon fins has inner sidewalls adjacent said gate conductor and further has outer sidewalls opposite said inner sidewalls;
a first dielectric layer, having a first thickness, on said inner sidewalls; and
a second dielectric layer, having a second thickness, on said outer sidewalls, wherein said first thickness is different from said second thickness.

19. An integrated circuit structure comprising:
a bulk wafer;
a silicon germanium conductor layer above and contacting said bulk wafer;
an insulator layer above and contacting said silicon germanium conductor layer;
a pair of silicon fins above and contacting said insulator layer, wherein said pair of silicon fins is separated by a space and wherein a width of said space is 0.5-3 times a width of one of said silicon fins;
a gate conductor in said space between said pair of silicon fins, wherein said pair of silicon fins has inner sidewalls adjacent said gate conductor and further has outer sidewalls opposite said inner sidewalls;
a first dielectric layer on said inner sidewalls; and
a second dielectric layer on said outer sidewalls, wherein said first dielectric layer comprises a different dielectric material than said second dielectric layer.

* * * * *